(12) United States Patent
Kawakami

(10) Patent No.: US 7,719,659 B2
(45) Date of Patent: May 18, 2010

(54) EXPOSURE APPARATUS AND DEVICE MANUFACTURING METHOD

(75) Inventor: Eigo Kawakami, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 128 days.

(21) Appl. No.: 12/060,393

(22) Filed: Apr. 1, 2008

(65) Prior Publication Data

US 2008/0186463 A1     Aug. 7, 2008

Related U.S. Application Data

(63) Continuation of application No. 11/030,515, filed on Jan. 5, 2005, now Pat. No. 7,382,434.

(30) Foreign Application Priority Data

Jan. 6, 2004     (JP) ............................. 2004-000827

(51) Int. Cl.
*G03B 27/52* (2006.01)
*G03B 27/42* (2006.01)
*G03B 27/54* (2006.01)
*G03B 27/58* (2006.01)

(52) U.S. Cl. ............................. 355/30; 355/53; 355/67; 355/72

(58) Field of Classification Search .................... 355/30, 355/53, 67, 77, 72, 75
See application file for complete search history.

(56) References Cited

U.S. PATENT DOCUMENTS

| 4,509,852 A | 4/1985 | Tabarelli et al. |
| 5,063,582 A * | 11/1991 | Mori et al. ..................... 378/34 |
| 5,610,683 A | 3/1997 | Takahashi |
| 7,382,434 B2 * | 6/2008 | Kawakami ................... 355/30 |
| 2003/0043352 A1 | 3/2003 | Sudoh et al. |
| 2005/0105070 A1 * | 5/2005 | Bartray et al. ................ 355/53 |
| 2005/0237501 A1 | 10/2005 | Furukawa et al. |
| 2006/0028632 A1 * | 2/2006 | Hazelton et al. ............... 355/53 |

FOREIGN PATENT DOCUMENTS

| JP | 10-303114 | 11/1998 |
| WO | 99/49504 | 9/1999 |
| WO | WO 2004/090634 | * 10/2004 |

* cited by examiner

*Primary Examiner*—Alan A Mathews
(74) *Attorney, Agent, or Firm*—Canon USA Inc IP Div

(57) ABSTRACT

An exposure apparatus includes a projection optical system for projecting a pattern of a mask onto a substrate, a holder for holding the substrate and having a first channel for the fluid to flow, and a fluid supply unit for supplying the fluid from the first channel of the holder to at least part of a space between the projection optical system and the substrate, the exposure apparatus exposing the substrate via the projection optical system and the fluid.

5 Claims, 8 Drawing Sheets

EXPOSURE APPARATUS AND DEVICE MANUFACTURING METHOD

CROSS-REFERENCE TO RELATED APPLICATIONS

This application is a continuation of U.S. patent application Ser. No. 11/030,515 filed Jan. 5, 2005, now U.S. Pat. No. 7,382,434 which claims priority to Japanese Patent Application No. 2004-000827 filed on Jan. 6, 2004, the entire contents of all of which are hereby incorporated by reference as if fully set forth herein.

BACKGROUND OF THE INVENTION

The present invention relates generally to an exposure apparatus that projects and exposes a mask pattern onto a substrate via a projection optical system, and a device manufacturing method that uses the exposure apparatus to manufacture various devices, such as a semiconductor chip and a liquid crystal panel, and more particularly to an exposure apparatus that fills the fluid in the space between the projection optical system and substrate, and exposes the substrate using the light via the fluid, and a device manufacturing method using such an exposure apparatus.

An exposure apparatus is required to use a shortened exposure wavelength and an increased numerical aperture ("NA") of a projection optical system along with the finer processing to the integrated circuit. Since the shortened wavelength has limits of a type of glass material used for the projection optical system, an immersion exposure has been proposed as a method to substantially shorten the exposure wavelength to expose the substrate using the light via the fluid filled in the space between the projection optical system and the substrate. The immersion exposure method includes a method (or a so-called local fill system) that arranges a fluid supplying/recovering nozzle around a lens at the top of the projection optical system, and fills the fluid only in the space between the wafer and the lens at the top of the projection optical system (see, for example, International Publication No. 99/49504 pamphlet), and a method for immersing the entire wafer in the fluid (see, for example, Japanese Patent Application, Publication No. 10-303114).

International Publication No. 99/49504 pamphlet discloses that the fluid controlled to the predetermined temperature is flowed between the projection optical system and the wafer. However, if a temperature difference occurs between the fluid and the wafer, a local thermal strain generates on the wafer, a change of the refractive index of the fluid lowers the resolution, and the yield of the exposure apparatus deteriorates consequently.

On the other hand, the method of Japanese Patent Application, Publication No. 10-303114 that immerses the entire wafer in the fluid solves a problem of the temperature difference between the fluid and the wafer to some extent. However, this method makes the structure of the exposure apparatus large and complex, and causes the fluid surface to swell as the stage moves, deteriorating the positioning performance of the stage, and dispersing the fluid.

BRIEF SUMMARY OF THE INVENTION

Accordingly, it is an exemplary object of the present invention to provide an exposure apparatus for easily reducing the local thermal strain on the wafer generated by the temperature difference between the wafer and the fluid to be supplied to a space between the projection optical system and the wafer for the immersion exposure.

An exposure apparatus according to one aspect of the present invention includes a projection optical system for projecting a pattern of a mask onto a substrate, a holder for holding the substrate and having a first channel for the fluid to flow, and a fluid supply unit for supplying the fluid from the first channel of the holder to at least part of a space between the projection optical system and the substrate, the exposure apparatus exposing the substrate via the projection optical system and the fluid.

An exposure apparatus according to another aspect of the present invention includes a projection optical system for projecting a pattern of a mask onto a substrate, a holder for holding the substrate, a fluid supply unit for supplying the fluid to at least part of a space between the projection optical system and the substrate, the exposure apparatus exposing the substrate via the projection optical system and the fluid, and a sensor for detecting a temperature of the substrate and/or the holder, wherein the fluid supply unit includes a temperature control unit for controlling, based on an output of the sensor, a temperature of the fluid to be supplied between the projection optical system and the substrate.

A device manufacturing method according to another aspect of the present invention includes the steps of exposing a substrate using the above exposure apparatus, and developing the substrate that has been exposed.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Embodiments of the present invention will now be described in detail in accordance with the accompanying drawings.

First Embodiment

Figure 1:
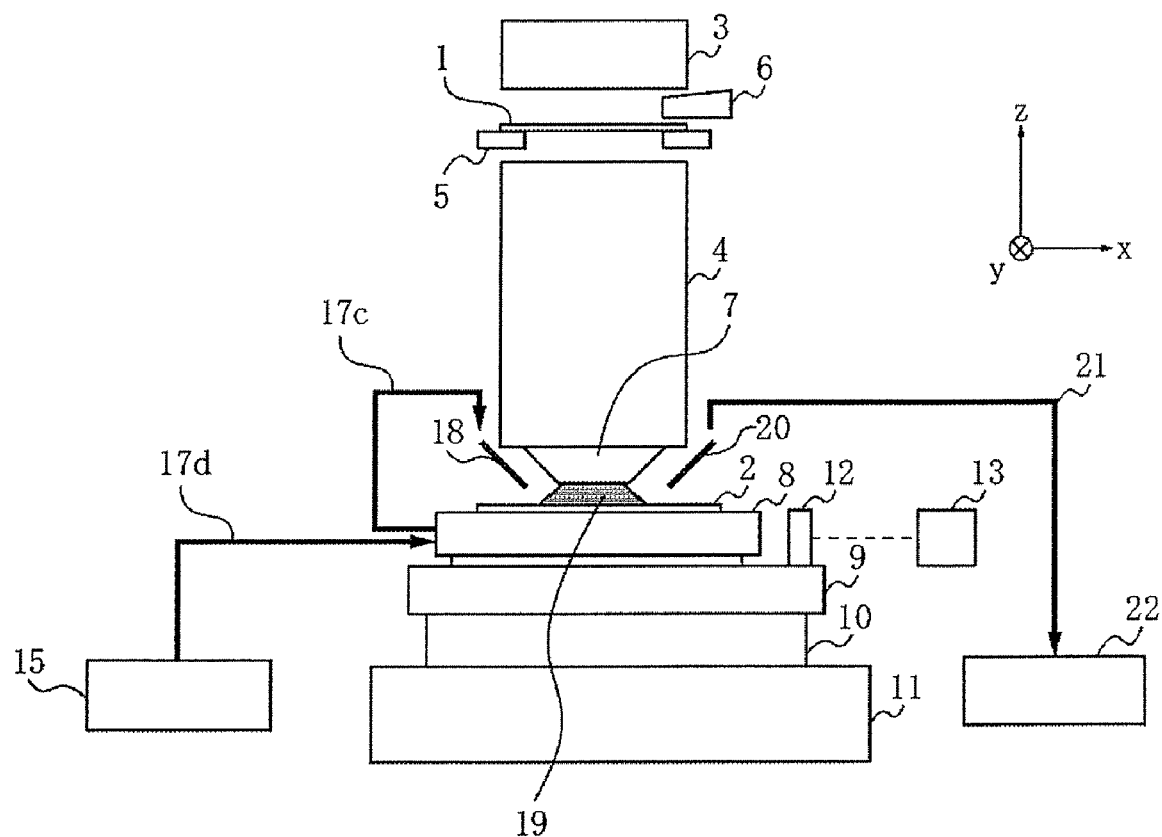
FIG. 1 shows a structure of an exposure apparatus according to a first embodiment of the present invention.

FIG. 1 shows a structure of an exposure apparatus according to a first embodiment of the present invention. The exposure apparatus of this embodiment uses a method (or so-called local fill system) that introduces the fluid only in the space between the wafer and the projection optical system. In FIG. 1, 1 denotes a mask (or a reticle) as an original that has a circuit pattern. 2 denotes a photosensitive agent applied wafer as a substrate onto which the circuit pattern on the mask 1 is exposed and transferred. 3 denotes an illumination optical system that includes a shutter, a dimmer, etc. and illuminates the mask using the light from the light source (not shown). 4 denotes a projection optical system for projecting a pattern on the mask 1 onto the wafer 2. 5 denotes a mask stage that holds the mask 1, and positions the mask 1 at a predetermined position. 6 denotes an alignment optical system used to position the mask 1 and align the mask image with the circuit pattern that has been already transferred on the wafer 2. 7 denotes part of the projection optical system 4 at the top thereof, and an optical element that opposes to the wafer 2 via the fluid and is closest to the wafer 2. 8 denotes a wafer chuck as a holder for holding the wafer 2. 9 denotes a fine movement stage that serves to correct a wafer 2's position in a .theta. direction (around the z axis), adjusts a wafer 2's z-position, and corrects a wafer 2's inclination or tilt. The fine movement stage 9 is arranged on the XY stage 10 for positioning the wafer 2 at a predetermined position. 11 denotes a base stool, on which the XY stage is placed. 12 denotes a reference mirror attached to the fine movement stage 9 in xy directions (with y direction not shown), and reflects the light from the laser interferometer 13 so as to measure the position of the fine movement stage 9.

15 denotes a fluid supply unit that supplies the fluid. 17*d* denotes a fluid supply pipe that introduces the fluid to the wafer chuck 8 from the fluid supply unit 15. 17*c* denotes a fluid supply pipe that introduces the fluid that flows a channel in or near the wafer chuck 8, to the fluid supply nozzle 18 near the projection optical system 4. These components constitute the fluid supply apparatus.

20 denotes a fluid recovery nozzle near the projection optical system 4. 21 denotes a fluid recovery pipe that connects the fluid recovery nozzle 20 with the fluid recovery unit 22. These components constitute the fluid recovery apparatus.

A description will now be given of the actual operations and effects of the thus structured apparatus. In exposure, the photosensitive agent applied wafer 2 is fed by a feeder (not shown) to the wafer chuck 8. The wafer 2 placed on the wafer chuck 8 is fixed by vacuum absorption or electrostatic absorption, experiences the plane leveling, and its temperature is maintained almost the same as that of the wafer chuck 8's temperature. Next, the fluid supply starts from the fluid supply unit 15, and the fluid 19 passes the channel (not shown) in the wafer chuck 8. After the temperature of the fluid becomes almost equal to that of the wafer chuck 8, the fluid is released from the fluid supply nozzle 18. This configuration reduces a temperature difference between the fluid 19 and the wafer 2 reduces, and restrains generations of the local thermal strains. Next, the fluid 19 is recovered from the fluid recovery nozzle 20 to the fluid recovery unit 22 so that extra fluid does not overflow into the non-exposure area on the wafer 2. When the fluid 19 is filled in the space between the wafer 2 and the optical element 7 in the projection optical system 4 and the supply and recovery of the fluid 19 stabilize, the thermal equilibrium is established between the fluid 19 and the optical element 7 of the projection optical system 4. The wafer 2s precise positioning (i.e., alignment and focus) and exposure are conducted in a similar manner of the usual dry-system exposure apparatus. When the step-and-scan action exposure of the entire surface of the wafer 2 completes, the fluid supply stops from the fluid supply unit 15. When the fluid recovery nozzle 20 recovers the fluid 19 from the space between the wafer 2 and the optical element 7 in the projection optical system 4, the vacuum absorption or electrostatic absorption of the wafer chuck 8 is released and the feeder (not shown) sends out the wafer 2 from the exposure apparatus.

This embodiment supplies to a space between the projection optical system and the wafer 2, the fluid 19 whose temperature becomes almost the same as the wafer chuck 8's temperature (or wafer 2's temperature) by letting the fluid pass through the wafer chuck 8. This configuration reduces a temperature difference between the fluid 19 and the wafer 2, and maintains the resolution.

Second Embodiment

Figure 2:
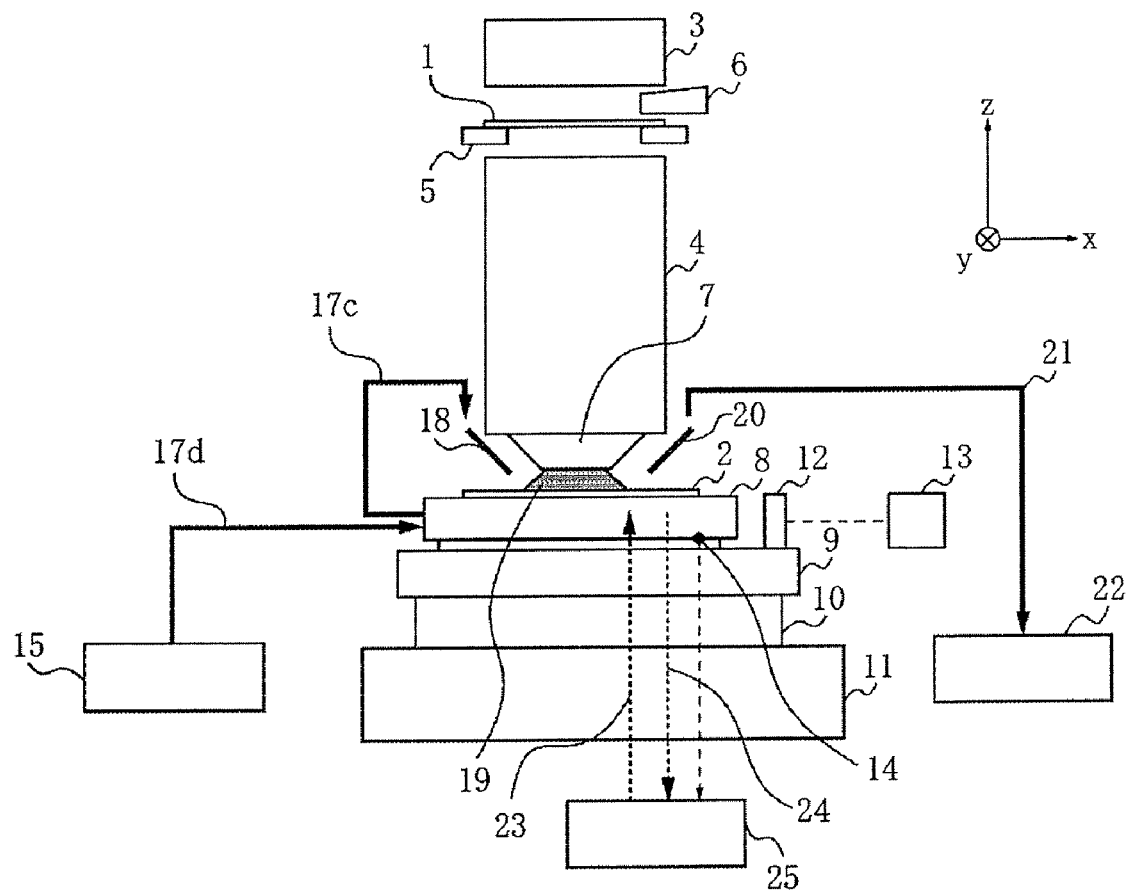
FIG. 2 shows a structure of an exposure apparatus according to a second embodiment of the present invention.

FIG. 2 shows a structure of an exposure apparatus according to a second embodiment of the present embodiment. Each element in FIG. 2 which is the same as corresponding element in FIG. 1 is designated by the same reference numeral as that shown in the first embodiment. The following description focuses on a difference from the exposure apparatus shown in FIG. 1.

14 denotes a temperature sensor that detects the temperature of the wafer shuck 8. While this embodiment detects the temperature of the wafer chuck and indirectly measures the wafer 2's temperature on the premise that the wafer chuck 8's temperature is approximately equal to the wafer 2's temperature, the wafer 2's temperature may be directly measured by arranging the temperature sensor 14 at a portion of the wafer check 8 near the wafer 2. This is true of the sensors in the following embodiments.

25 denotes a wafer-chuck temperature controller that supplies and recovers the water that has been temperature controlled to a predetermined temperature so as to maintain the temperature of wafer chuck approximately constant. The wafer-chuck temperature controller 25 includes a wafer-chuck temperature-controlled-water supply pipe 23, and a wafer-chuck temperature-controlled-water recovery pipe 24. The water that has been temperature controlled by the wafer-chuck temperature controller 25 to the predetermined temperature circulates through the wafer-chuck temperature-controlled-water supply pipe 23, a channel (not shown) different from the fluid flowing channel in the wafer chuck 8 of the first embodiment, and wafer-chuck temperature-controlled-water recovery pipe 24.

It is possible similar to the first embodiment to equalize the fluid's temperature approximately with that of the wafer 2 held by the wafer chuck 8 by letting the fluid pass in the wafer shuck 8 and supplying the fluid in the space between the projection optical system and the wafer.

In changing the wafer 2's temperature, the wafer-chuck temperature controller 25 changes the set temperature of the temperature-controlled water. Accordingly, the temperature of the fluid 19 to be supplied to a space between the projection optical system and the wafer automatically becomes the changed temperature. Other operations are similar to those discussed in the first embodiment.

While the temperature controller of the instant embodiment flows the temperature-controlled water, the present invention may use a Peltier device and other known means. Instead of flowing the water in the channel, another fluid or gas may be flowed.

Third Embodiment

Figure 3:
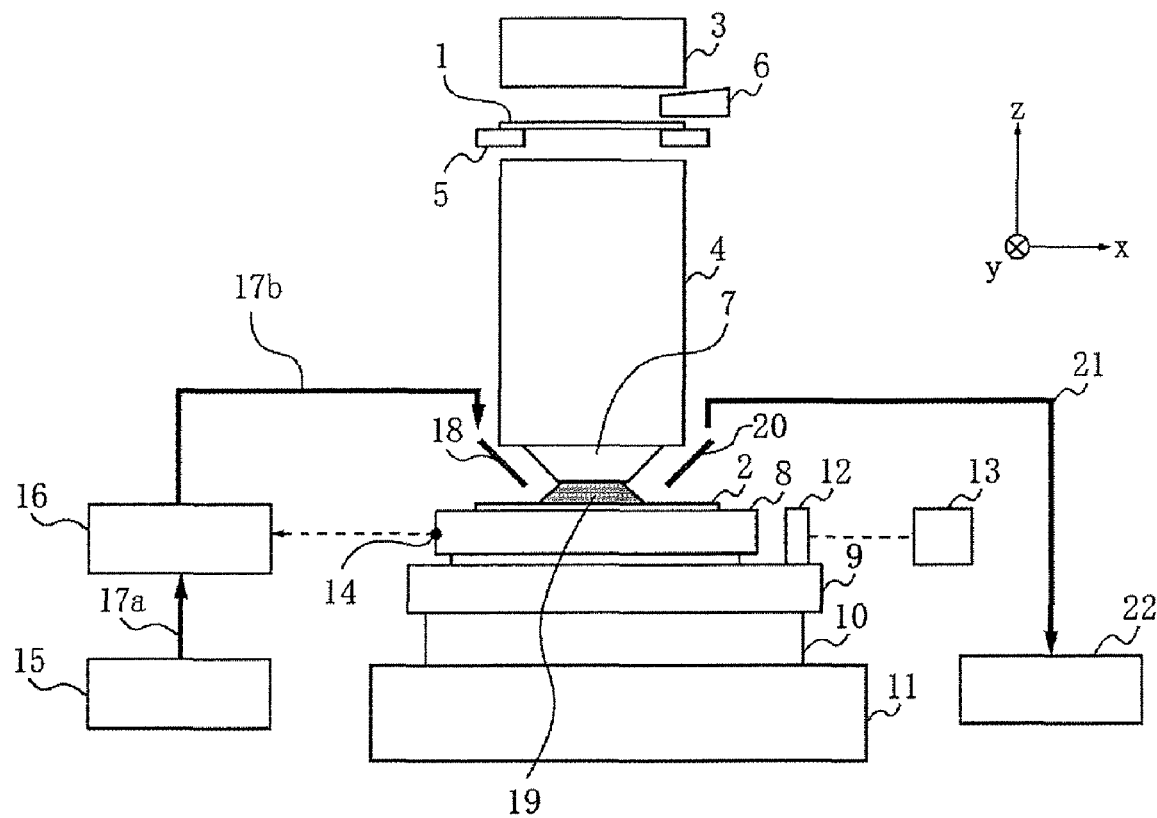
FIG. 3 shows a structure of an exposure apparatus according to a third embodiment of the present invention.

FIG. 3 shows a structure of an exposure apparatus according to a third embodiment of the present embodiment. Each element in FIG. 3 which is the same as corresponding element in FIG. 1 is designated by the same reference numeral as that shown in the first embodiment. The following description focuses on a difference from the exposure apparatus shown in FIG. 1. Similar to FIG. 2, 14 denotes a temperature sensor that detects the temperature of the wafer shuck 8. 16 denotes a fluid temperature control unit that controls the temperature of the fluid supplied from the fluid supply apparatus to the temperature of the wafer shuck 8 in accordance with an output of the temperature sensor 14. 17a and 17b are fluid supply pipes, and connect the fluid supply unit 15, the fluid temperature control unit 16, and the fluid supply nozzle 18 to one another. This embodiment controls the temperature of the fluid supplied from the fluid supply unit 15 so that it becomes almost the same as the temperature of the wafer chuck 8 using the fluid temperature control unit 16, and releases the fluid from the fluid supply nozzle 18. Other operations are similar to those discussed in the first embodiment.

This embodiment supplies to a space between the projection optical system and the wafer 2, the fluid 19 whose temperature becomes almost the same as the wafer chuck 8's temperature (or wafer 2's temperature). This configuration reduces the temperature difference between the fluid 19 and the wafer 2, and maintains the resolution.

Fourth Embodiment

Figure 4:
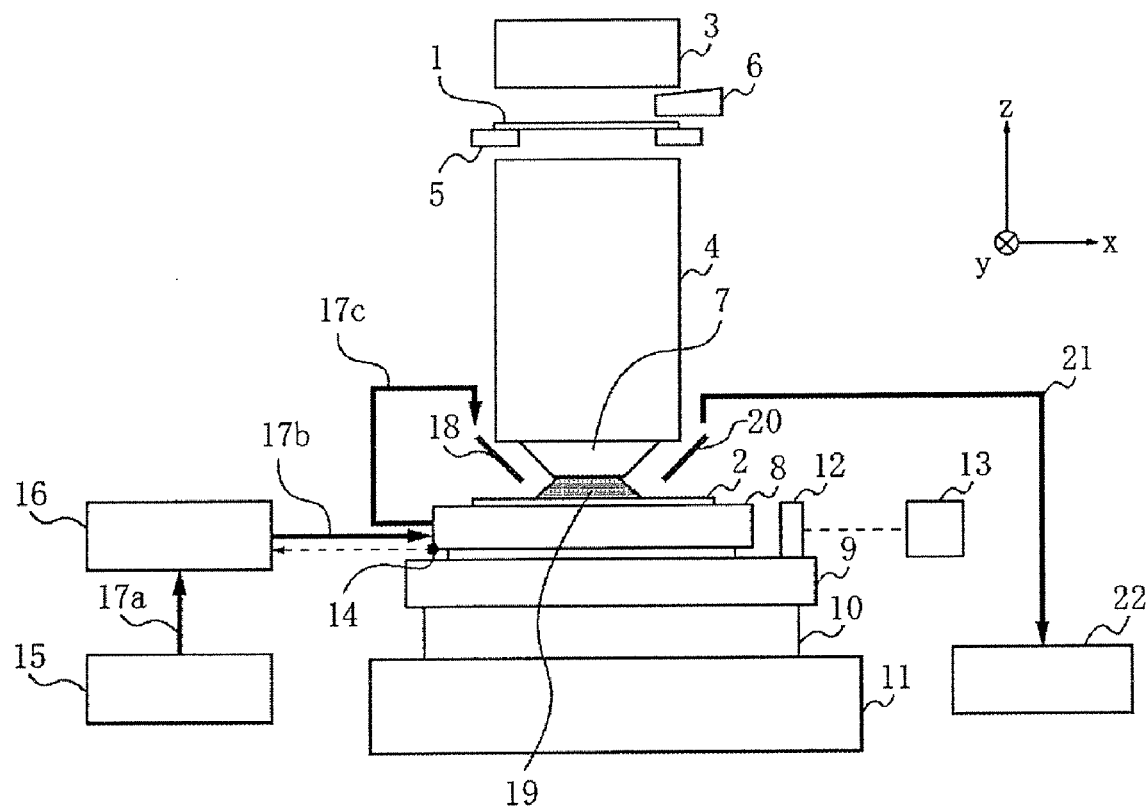
FIG. 4 shows a structure of an exposure apparatus according to a fourth embodiment of the present invention.

FIG. 4 shows a structure of an exposure apparatus according to a fourth embodiment of the present embodiment. Each element in FIG. 4 which is the same as corresponding element in FIG. 3 is designated by the same reference numeral as that shown in the third embodiment. A structural difference from FIG. 3 is that the fluid supply pipe 17b connects the fluid temperature control unit 16 to the wafer chuck 8, and the fluid supply pipe 17c connects the wafer shuck 8 to the fluid supply nozzle 18. Due to this structural difference, an operational difference from the third embodiment is that the fluid whose temperature has been controlled by the fluid temperature control unit 16 to the wafer chuck 8's temperature is circulated in the wafer chuck 8 and then supplied to the fluid supply nozzle 18. This structure can make the temperature of the fluid 19 released from the fluid supply nozzle 18 closer to the wafer 2's temperature. In changing the wafer 2's temperature in a manner similar to that of the second embodiment, the fluid temperature control unit 16 changes the set temperature of the fluid 19.

Fifth Embodiment

Figure 5:
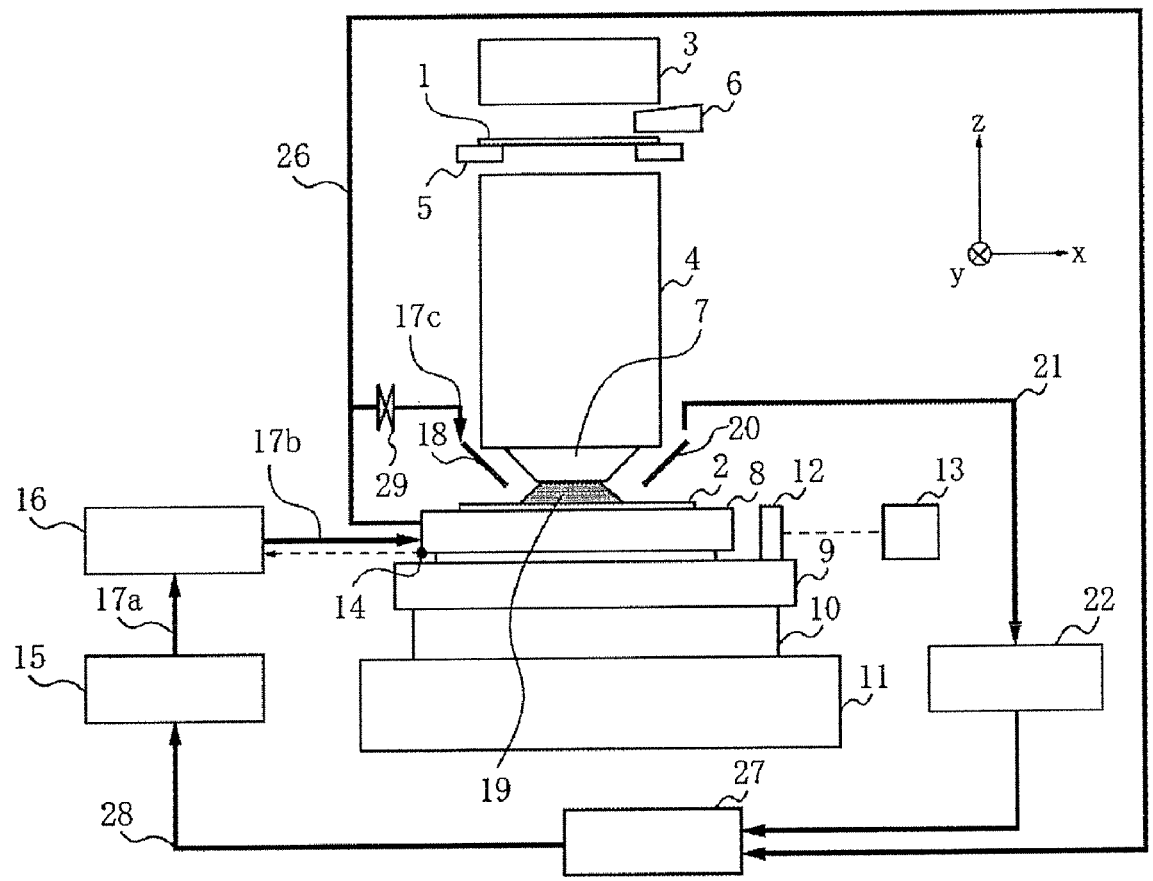
FIG. 5 shows a structure of an exposure apparatus according to a fifth embodiment of the present invention.

FIG. 5 shows a structure of an exposure apparatus according to a fifth embodiment of the present embodiment. Each element in FIG. 5 which is the same as corresponding element in FIG. 4 is designated by the same reference numeral as that shown in the fourth embodiment. The following description focuses on a difference from the exposure apparatus shown in FIG. 4.

26 denotes a bypass pipe of the fluid 19 that branches part of the fluid that circulates through the channel located in or adjacent to the wafer chuck 8, and introduces the fluid to the fluid recycle unit. The fluid recycle unit 27 also receives the fluid from the fluid recovery unit 22, removes contaminations and fine air bubbles that occur during the exposure, and enables the fluid to be supplied again. 28 denotes a fluid recycle pipe that introduces the fluid 19 recycled by the fluid recycle unit 27 to the fluid supply unit 15. These components constitute a fluid recovery apparatus.

29 denotes a fluid supply control valve provided to the fluid supply pipe 17c, and controls the supply amount of the fluid 19 in accordance with the command from the fluid supply unit 15.

A description will be given of the operation of the instant embodiment. Although the fluid supply unit 15 always supplies the fluid 19, the fluid supply control valve 29 is in a closed state during the non-exposure time and thus the fluid is fed to the fluid recycle unit 27 via the fluid bypass pipe 26 and returns to the fluid supply unit 15 via the fluid recycle pipe 28. Therefore, the fluid whose temperature is controlled to the predetermined temperature by the fluid temperature control unit 16 always circulates in the exposure apparatus. As described in the first embodiment, the fluid 19 is supplied to the space between the wafer 2 and the optical element 7 in the projection optical system 4 only during the exposure time, the fluid supply control valve 29 is opened in accordance with the command of the fluid supply unit 15 and the fluid 19 having the same temperature as the wafer 2 is supplied by the supply nozzle 18. When the exposure ends, the fluid supply valve 29 is again closed in accordance with the command of the fluid supply unit 15. The recovery of the fluid 19 is as described for the first embodiment. In changing the wafer 2's temperature, similar to the fourth embodiment, the fluid temperature control unit 16 changes the set temperature of the fluid 19.

Sixth Embodiment

Figure 6:
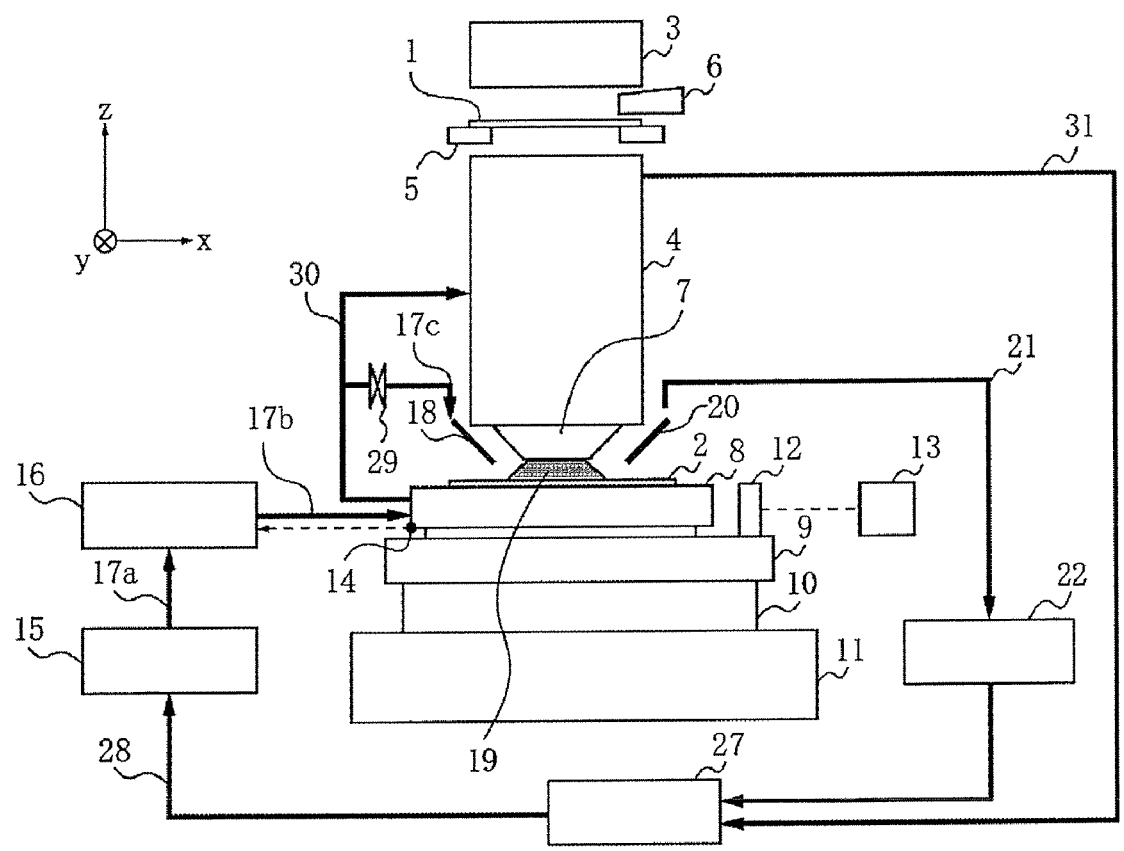
FIG. 6 shows a structure of an exposure apparatus according to a sixth embodiment of the present invention.

FIG. 6 shows a structure of an exposure apparatus according to a sixth embodiment of the present embodiment. Each element in FIG. 6 which is the same as corresponding element in FIG. 5 is designated by the same reference numeral as that shown in the fifth embodiment. The following description focuses on a difference from the exposure apparatus shown in FIG. 4.

30 denotes a projection-optical-system temperature-controlling supply pipe that branches part of the fluid 19 that circulates in the wafer chuck 8, and introduces the fluid to the projection optical system 4. 31 denotes a projection-optical-system temperature-controlling recovery pipe that introduces to the fluid recycle apparatus 27 the fluid 19 that circulates through the channel (not shown) in the projection optical system 4.

A difference from the fifth embodiment is that the fluid 19 that circulates in the wafer chuck 8 circulates in or near the projection optical system 4 so as to equalize, to one another, the temperatures among three members, i.e., the wafer 2, the projection optical system 4 (lens 7) and the fluid 19 which are connected through the fluid 19 during the exposure. Thereby, a temperature difference between the projection optical system 4 and the fluid 19 reduces, and generations of the local thermal strains on the wafer 2, which would otherwise occur due to the temperature difference between them, are restrained.

Only the top of the projection optical system 4 may have a channel near the optical element 7. In changing the wafer 2's temperature, similar to the fourth embodiment, the fluid temperature control unit 16 changes the set temperature of the fluid 19.

Since this embodiment reduces the temperature difference between the optical element 7 and the fluid, in addition to the temperature difference between the wafer and the fluid, this embodiment can further restrain the generations of the local thermal strains and maintain the resolution performance of the exposure apparatus.

As discussed, the exposure apparatus of the instant embodiment serves to prevent generations of the thermal strains due to the temperature difference between the wafer and the fluid.

One means serves both as the temperature control means for a substrate holding means and the temperature control means for the immersion-exposure fluid by letting the temperature controlled fluid pass inside the substrate holder (or the wafer chuck) and then supplying the fluid to a space between the projection optical system and the substrate (wafer). As a result, the apparatus structure becomes simple.

Since the temperature of (the optical element in) the projection optical system is almost equal to that of the immersion-exposure fluid, the temperature differences among three components, i.e., the wafer, the fluid and the (the optical element in) the projection optical system during the exposure can be reduced, and the thermal strains due to the temperature differences and the resultant deterioration of the yield can be prevented.

While the above embodiment discusses with the step-and-scan exposure apparatus, the present invention is applicable to the step-and-repeat exposure apparatus so as to obtain similar effects.

Of course, components in the exposure apparatus of each embodiment is applicable to exposure apparatuses of other embodiments Seventh Embodiment A description will now be given of an embodiment of a device manufacturing method using the above exposure apparatus of the above embodiment.

Figure 7:
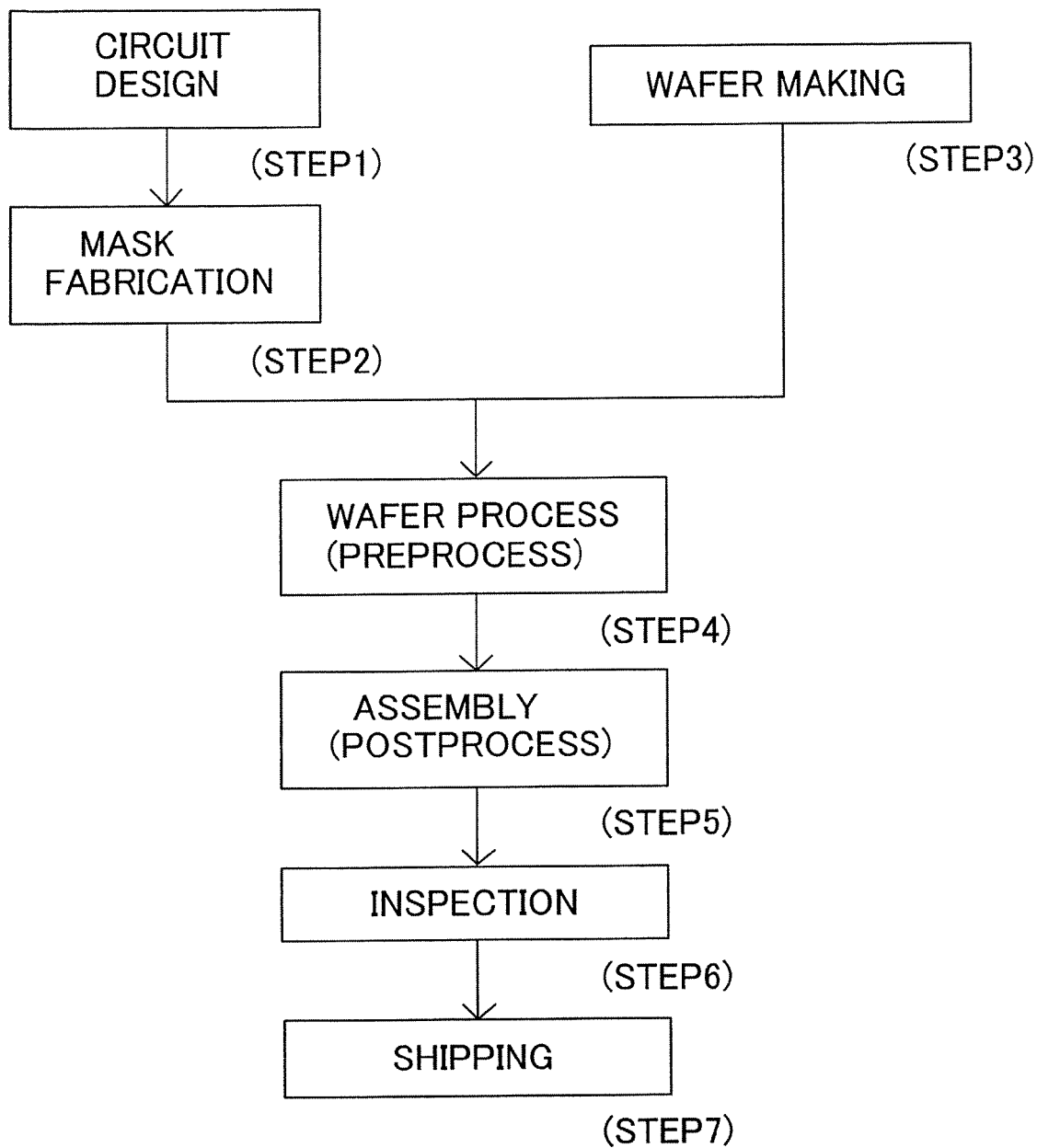
FIG. 7 is a device manufacturing flow.

FIG. 7 is a manufacture flow of fine devices (i.e., semiconductor chips such as IC and LSI, LC panels, CCDs, thin film magnetic heads, micro-machines, etc.). Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 8:
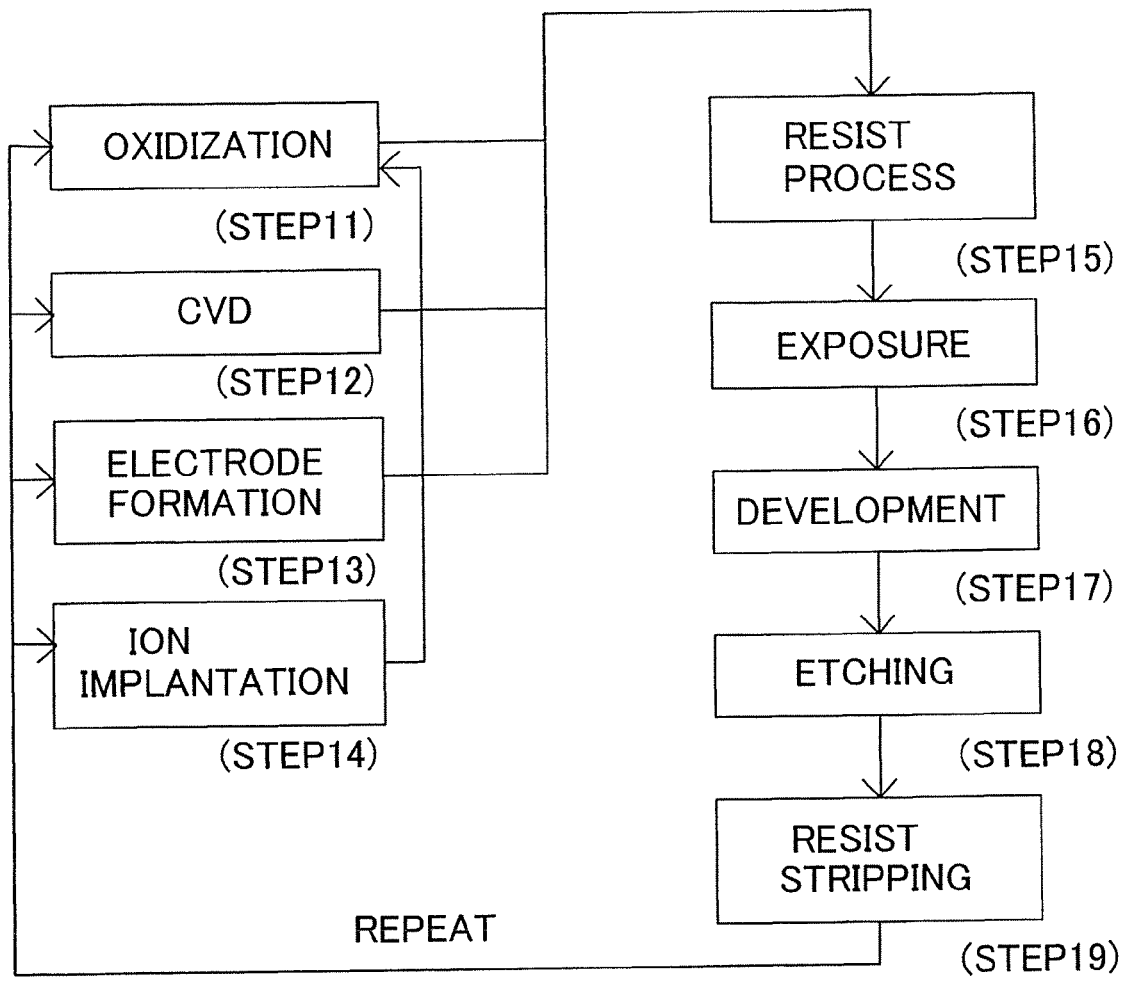
FIG. 8 is a wafer process in FIG. 7.

FIG. 8 is a detailed flow of the wafer process. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the aforementioned exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. Use of the manufacture method of the instant embodiment would manufacture highly integrated semiconductor devices, which have been conventionally hard to be manufactured.

The entire disclosure of Japanese Patent Application No. 2004-000827 filed on Jan. 6, 2004 including claims, specification, drawings, and abstract are incorporated herein by reference in its entirety.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus that includes a projection optical system for projecting a pattern of a mask onto a substrate and exposes the substrate via liquid filled only in a space between the projection optical system and a part of the substrate, said exposure apparatus comprising:
   a chuck for holding the substrate; and
   a liquid supply unit for supplying the liquid that flows through a channel included in the chuck to the space between the projection optical system and the substrate,
   wherein a temperature of the liquid becomes equal to that of the chuck by passage of the liquid through the channel, and the liquid having the temperature equal to that of the chuck is supplied to the space between the projection optical system and the substrate.

2. An exposure apparatus according to claim 1, further comprising a temperature controller for controlling the temperature of said chuck.

3. An exposure apparatus according to claim 1, further comprising a sensor for detecting the temperature of said chuck,
   wherein said liquid supply unit includes a temperature control unit that controls the temperature of the liquid supplied to the channel of the chuck based on an output of said sensor.

4. An exposure apparatus according to claim 1, wherein said projection optical system has a channel disposed near a lens of said projection optical system that faces the substrate via the liquid, and said liquid supply unit flows the liquid from the channel included in said chuck to the channel included in said projection optical system.

5. An exposure apparatus according to claim 1, wherein said chuck has a second channel different from the channel, and the temperature controller controls the temperature of the chuck by passage of a fluid through the second channel.

* * * * *